United States Patent [19]
Maeda et al.

[11] Patent Number: 5,341,021
[45] Date of Patent: Aug. 23, 1994

[54] BIPOLAR TRANSISTOR HAVING AN ELECTRODE STRUCTURE SUITABLE FOR INTEGRATION

[75] Inventors: Takeo Maeda; Hiroshi Momose, both of Tokyo, Japan

[73] Assignee: Kabushiki Kaisha Toshiba, Kawasaki, Japan

[21] Appl. No.: 849,102

[22] Filed: Mar. 9, 1992

[30] Foreign Application Priority Data

Mar. 18, 1991 [JP] Japan ................................. 3-052762

[51] Int. Cl.$^5$ ...................... H01L 29/40; H01L 29/70; H01L 27/082
[52] U.S. Cl. .................................... 257/587; 257/588; 257/557; 257/564
[58] Field of Search ................ 257/557, 565, 587, 588, 257/762, 768

[56] References Cited

U.S. PATENT DOCUMENTS

| | | | |
|---|---|---|---|
| 4,716,314 | 12/1987 | Mulder et al. | 257/556 |
| 4,860,085 | 8/1989 | Feygenson | 257/755 |
| 4,882,290 | 11/1989 | Komatsu | 257/588 |
| 5,184,206 | 2/1993 | Neugebauer et al. | 257/762 |

*Primary Examiner*—Rolf Hille
*Assistant Examiner*—Wael Fahmy
*Attorney, Agent, or Firm*—Finnegan, Henderson, Farabow, Garrett & Dunner

[57] ABSTRACT

A contact hole for guiding an emitter electrode of bipolar transistors continuously arrayed and a contact hole for guiding a base electrode are positioned not to be arranged in the continuous array direction of the bipolar transistors. Also, the emitter electrode and the base electrode are respectively drawn from these contact holes in two directions different from the continuous array direction of the bipolar transistors. At least one of the base electrode and the emitter electrode is formed on a conductive layer of a polycide structure contacting an active region in a substrate to be connected.

10 Claims, 8 Drawing Sheets

BIPOLAR TRANSISTOR HAVING AN ELECTRODE STRUCTURE SUITABLE FOR INTEGRATION

BACKGROUND OF THE INVENTION

1. Field of the Invention

The present invention relates to the structure of a bipolar transistor to be used in a semiconductor device requiring high integration such as a memory LSI formed of a bipolar/CMOS combination integrated circuit (BiCMOS circuit).

2. Description of the Related Art

Figure 1:
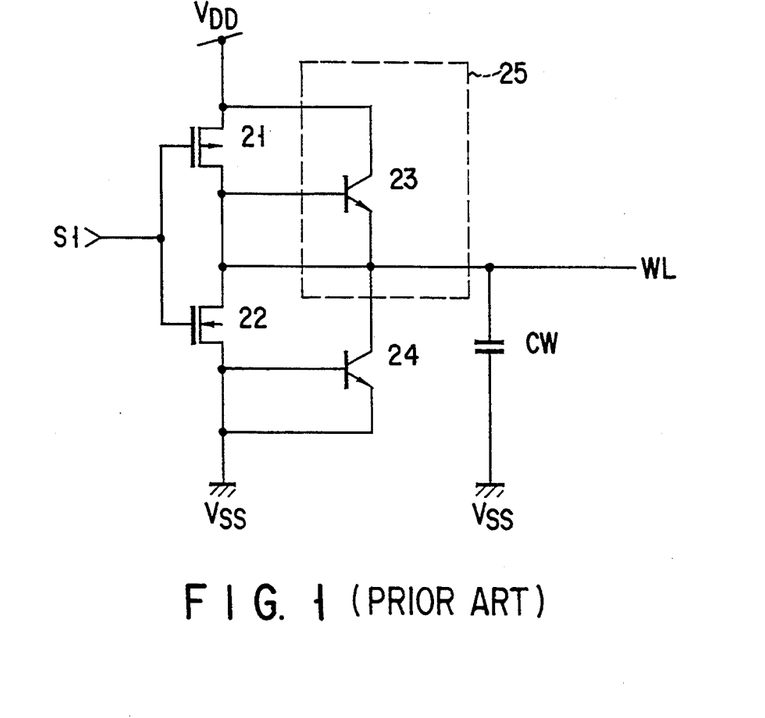
FIG. 1 is a circuit diagram showing the structure of a BiCMOS logic gate formed in a semiconductor memory chip.

There is arranged a BiCMOS logic gate as shown in FIG. 1 at a position adjacent to a memory cell array in a memory LSI. A p channel MOS transistor 21 or an N channel MOS transistor 22 is operated by a control signal S1 sent from a decoder (not shown). Due to this, the voltage of a word line WL is pulled up or pulled down by a bipolar transistor 23 or 24 of the output stage. CW is a load capacity of the word line WL.

Figure 2A:
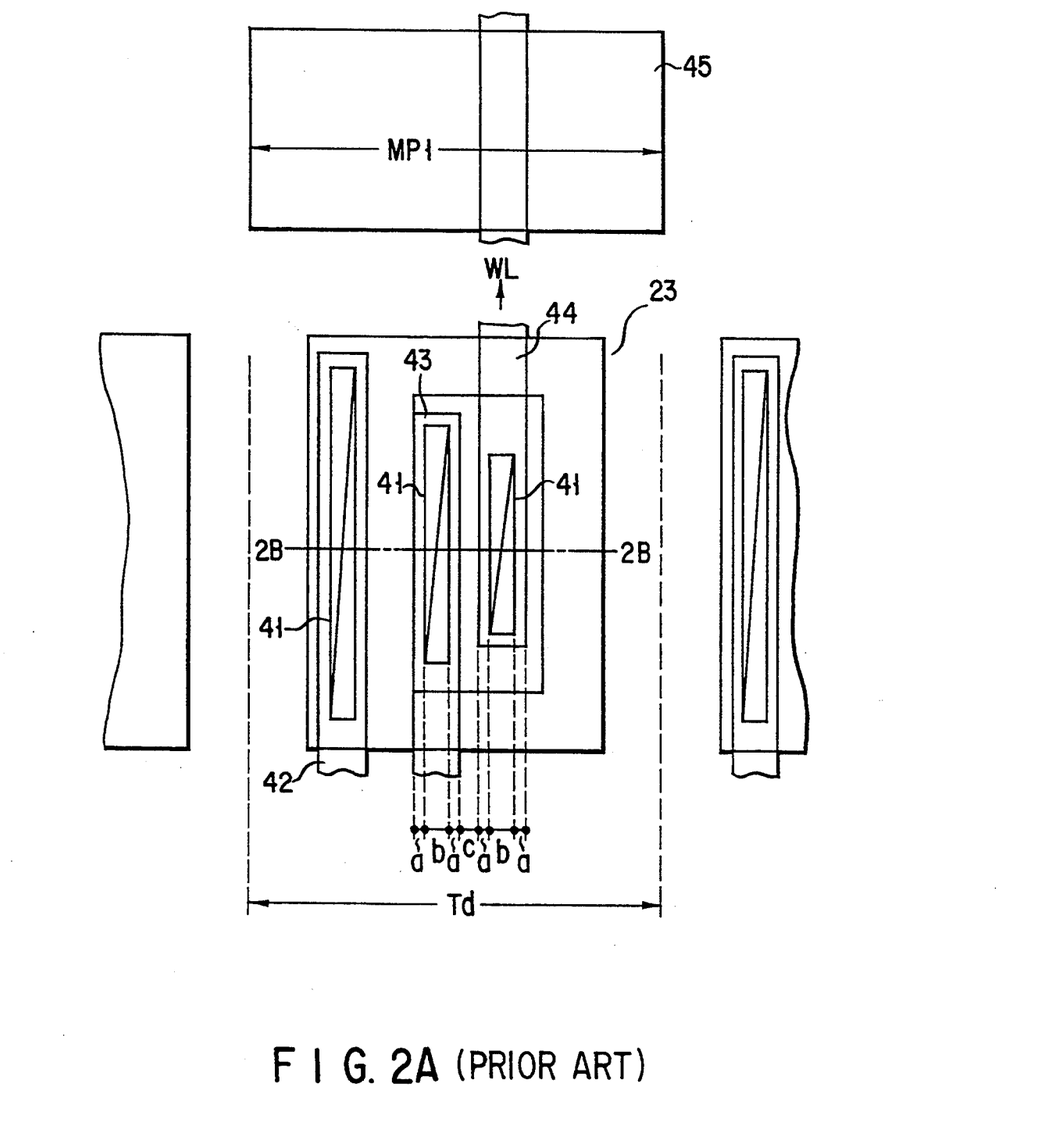
FIG. 2A is a plane view showing the structure of a conventional bipolar transistor driving a word line WL of a memory cell.
Figure 2B:
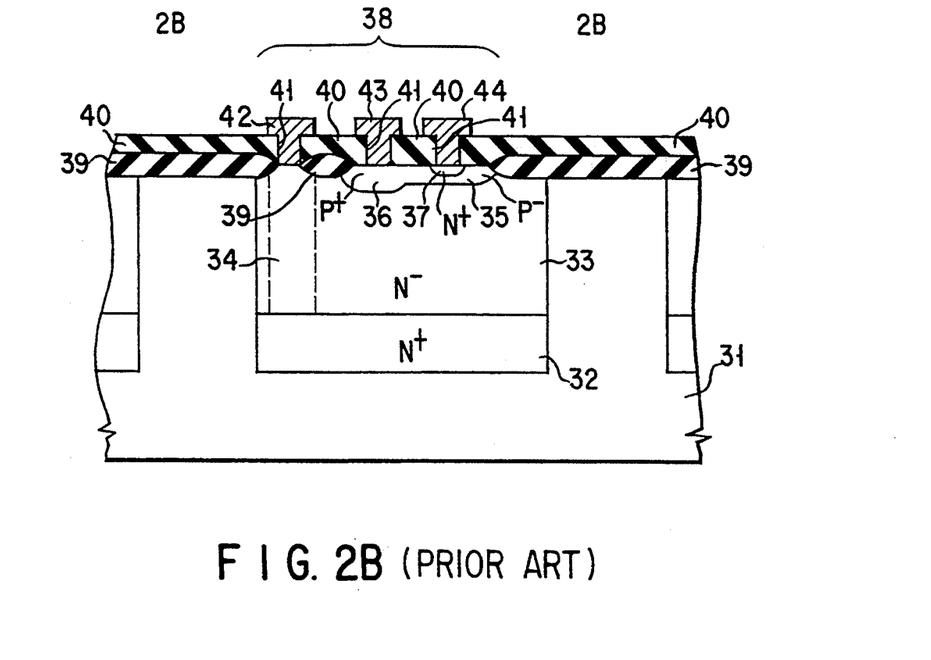
FIG. 2B is a cross sectional view taken along line 2B—2B of FIG. 2A.
Figure 3:
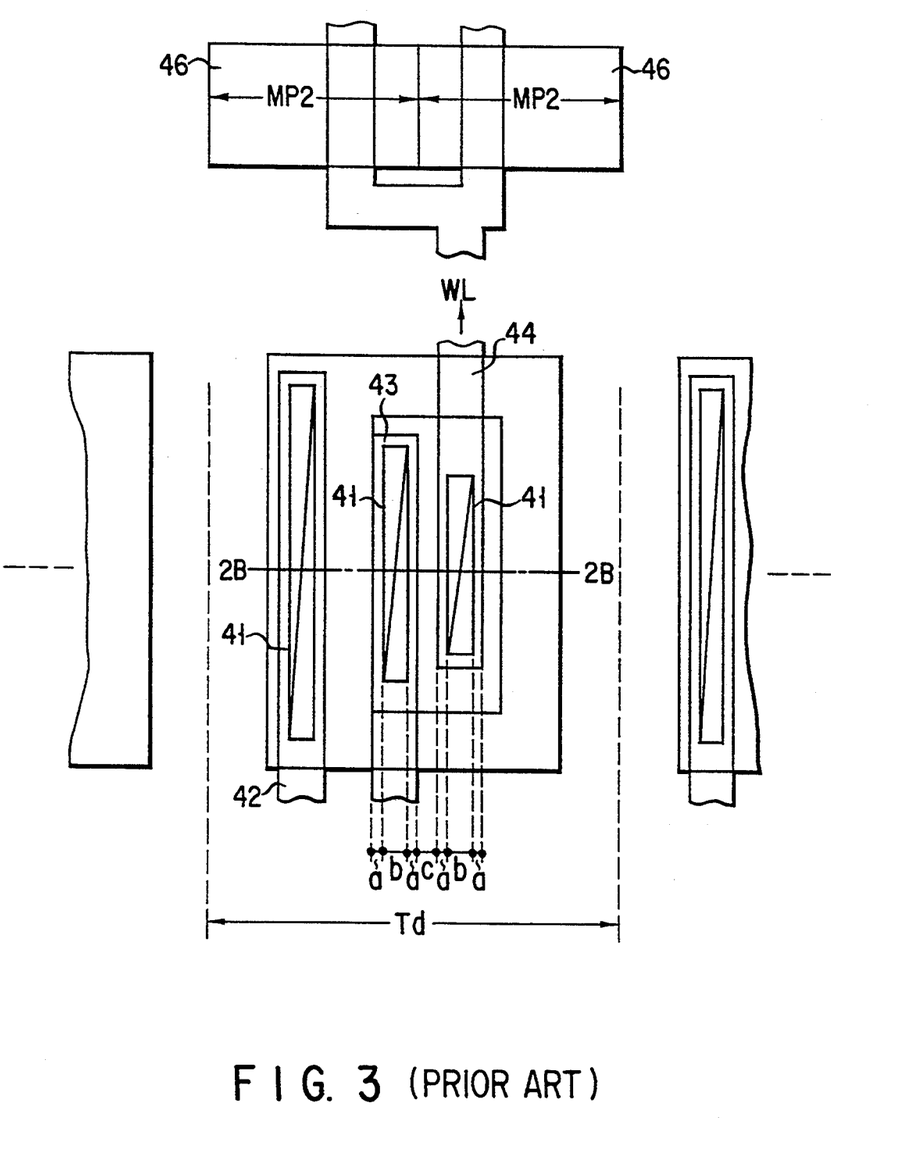
FIG. 3 is a plane view showing a specific example of a positional relationship between a memory cell pitch and the conventional bipolar transistor.

FIG. 2A is a plane view showing the structure of one bipolar transistor 23 in the BiCMOS logic gate of FIG. 1 driving the word line WL. This is a portion enclosed with a broken line 25. FIG. 2B is a cross sectional view along a line 2B—2B of FIG. 2A. On a bury N+ type region 32 formed in a silicon substrate 31, there is formed an N− type collector region 33 whose concentration is lower than concentration of the N+ type region 32. On the surface of the collector region 33, there are formed a diffusion region 34 for taking out a collector, a P− type intrinsic base region 35, a P+ type external base region 36 whose concentration is higher than concentration of the P− type region 35 and a N+ type emitter region 37. A field insulating film 39 is formed in the periphery of a transistor region 38. An interlayer insulating film 40 is formed to cover the transistor region 38 and the field insulating film 39. Contract holes 41 are formed in the surface of the interlayer insulating film 40, and a collector electrode 42, a base electrode 43 and an emitter electrode 44 are respectively formed in the holes. The emitter electrode 44 is connected to the word line WL. In other words, one bipolar transistor is formed for a pitch MP 1 of a memory cell 45 in the memory cell region extending to the word line WL. Or, as shown in FIG. 3, a ½ bipolar transistor is formed for a pitch MP 2 of a memory cell 46. In FIG. 3, the emitter electrode 44 is connected to two word lines.

The respective electrodes 42, 43, and 44 of the bipolar transistors are directly taken out of the respective active regions 34, 36, and 37 through the contact holes 41. The shape of the metal of the emitter electrode 44 and the base electrode 43 and that of the contact hole, which are brought into contact with an active region 37 of a substrate 31 to an active region 36, are rectangular, and the directions of the long sides are parallel to each other. The arrangement is made such that the long sides are perpendicular to a line 2B—2B passing the centers of the above rectangular shapes. The above arrangement makes it possible to uniform a distance where the emitter electrode 44 of the bipolar transistor is connected to the base electrode 43 through the active region. Moreover, the distance can be minimized, so that a parasitic resistance in the emitter region 37 and the base region 36 can be considerably controlled.

According to the above-mentioned structure, the area of transistor size Td is largely occupied by the contact size of the metal of each electrode, a joint allowance between the contact and the metallic wires, and the sum (4a+2b+c) of the minimum working size between the wires.

In accordance with increase in the memory capacity and decrease in the working size, the memory size is increasingly made small. Due to this, in the size Td of the above-structured bipolar transistor including the element separation region, it is difficult to reduce the size of the bipolar transistor corresponding to the memory size. In other words, if the memory cell is much more reduced, the bipolar transistor functioning as a driver must drive the word lines which are more than two. Due to this, the capacities of the word lines increase, and this prevents the high speed operation of the memory.

As mentioned above, in the conventional device, one to ½ bipolar transistor functioning as a driver is formed for the pitch of the memory cell to be adjacent to the memory cell array. However, the conventional working size cannot deal with the reduction of the memory size.

SUMMARY OF THE INVENTION

An object of the present invention is to provide a semiconductor device which can correspond to a reduced memory size and is structured such that a one to ½ bipolar transistor is arranged for a pitch of the reduced memory cell.

The object of the invention can be attained by the following structure.

A semiconductor device comprises bipolar transistors continuously arrayed, and each having a collector electrode, an emitter electrode and base electrode, wherein a first contact hole for guiding said emitter electrode and a second contact hole for guiding said base electrode are positioned not to be arranged in the continuous array direction of said bipolar transistor, and said emitter electrode and said base electrode are respectively drawn from said first and second contact holes in two directions different from the continuous array direction of said bipolar transistor.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

The embodiments will be explained with reference to the drawings.

Figure 4A:
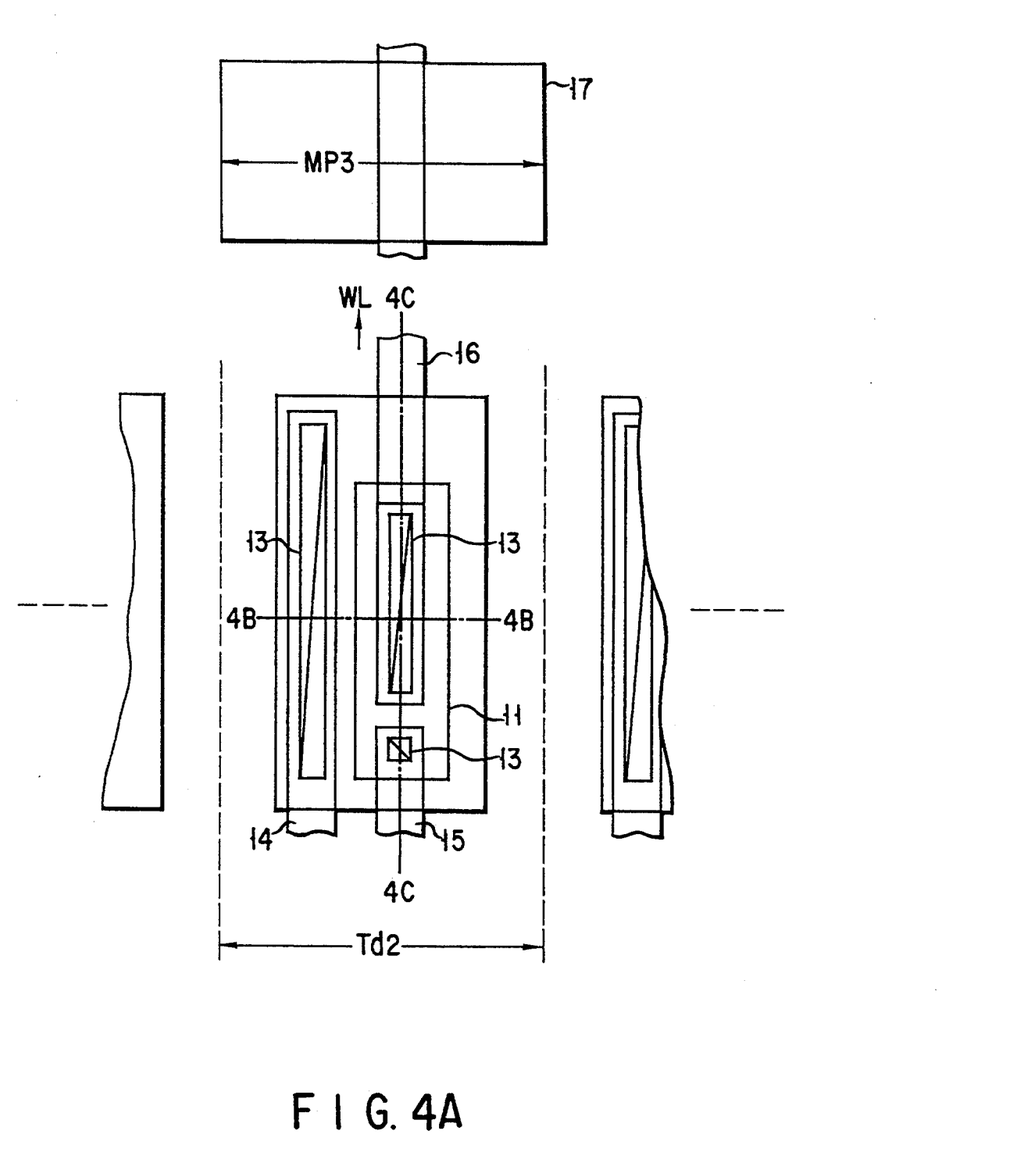
FIG. 4A is a plane view showing the structure of a bipolar transistor according to a first embodiment of the present invention.
Figure 4B:
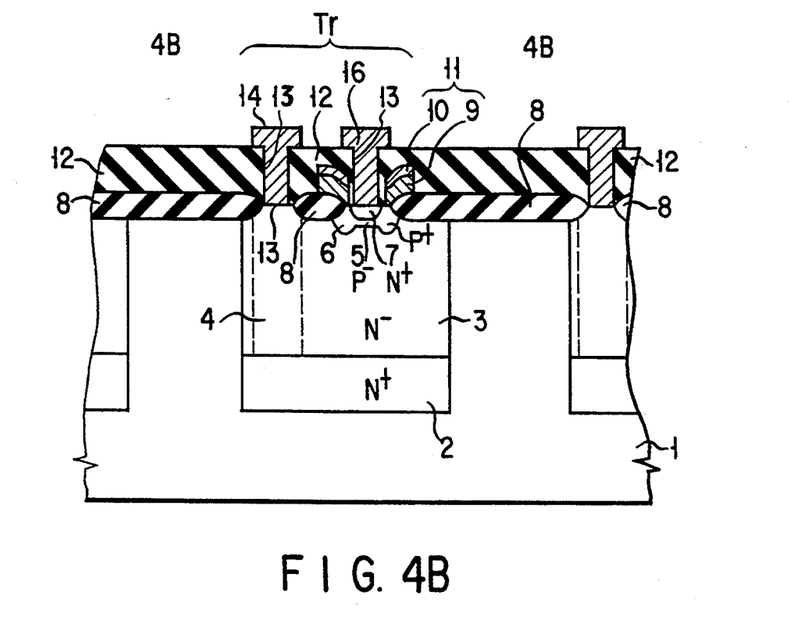
FIG. 4B is a cross sectional view taken along line 4B—4B of FIG. 4A.
Figure 4C:
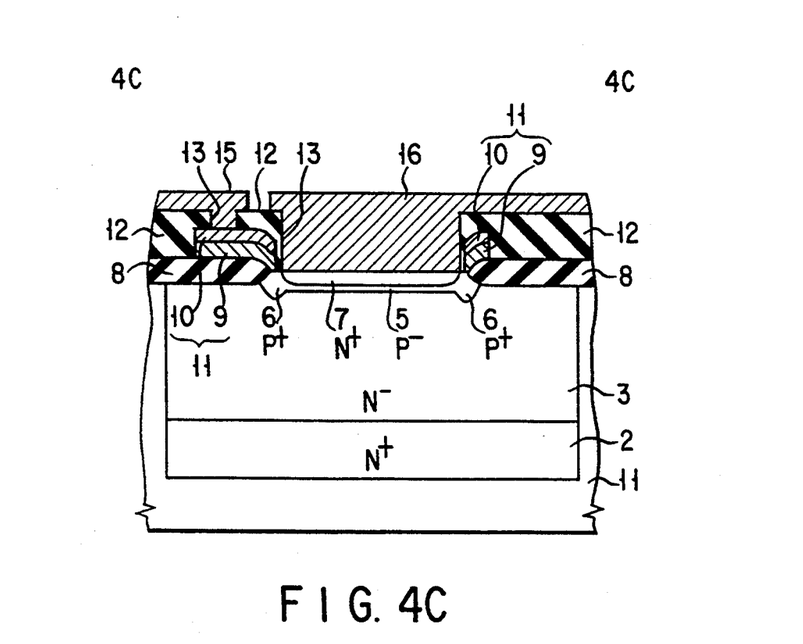
FIG. 4C is a cross sectional view taken along line 4C—4C of FIG. 4A.

FIG. 4A is a plane view showing one bipolar transistor in a BiCMOS logic gate driving a word line WL of a memory cell according to the first embodiment of the present invention. FIG. 4B is a cross sectional view taken along line 4B—4B of FIG. 4A. FIG. 4C is a cross sectional view taken along line 4C—4C of FIG. 4A. On an N+ type region 2 buried in a silicon substrate 1, there is formed an N− type collector region 3 whose concentration is lower than concentration of the N+ type region 2. On a surface of a collector region 3, there are formed a diffusion layer 4, a P− type intrinsic base region 5, a P+ type outer base region 6 whose concentration is higher than concentration of the P− type region 5, and an N− type emitter region 7. A field insulating film 8 separates these elements of a transistor region Tr.

A polycrystalline silicon film 9 is formed so as to contact the surroundings of the outer base region 6 and extend to the field insulating film 8 enclosing the outer base region 6. A silicide film 10 is formed on the polycrystalline silicon film 9. A polycide film 11 is formed of these polycrystalline silicon film 9 and the silicide film 10. A collector electrode 14, a base electrode 15, and an emitter electrode 16 are formed through a contact hole 13 formed on an interlayer insulating film 12, respectively. The emitter electrode 16 is structured to be connected to the word line WL. Thereby, one bipolar transistor is formed for a pitch MP3 of a memory cell 17 of the memory cell region extending in the direction of the word line WL.

In other words, the bipolar transistors are laid out to be continuously arrayed in both directions of line 4B—4B of FIG. 4A. One direction of line 4C—4C, that is, the direction of the word line WL is a layout region of the memory cell. Therefore, the emitter electrode 16 of the bipolar transistor and the contact hole 13 for guiding the base electrode 15 are positioned not to be arranged in the continuous array direction of said bipolar transistor. The emitter electrode 16 and the base electrode 15 are structured to be extended in two directions different from the continuous array direction of said bipolar transistor.

Figure 5:
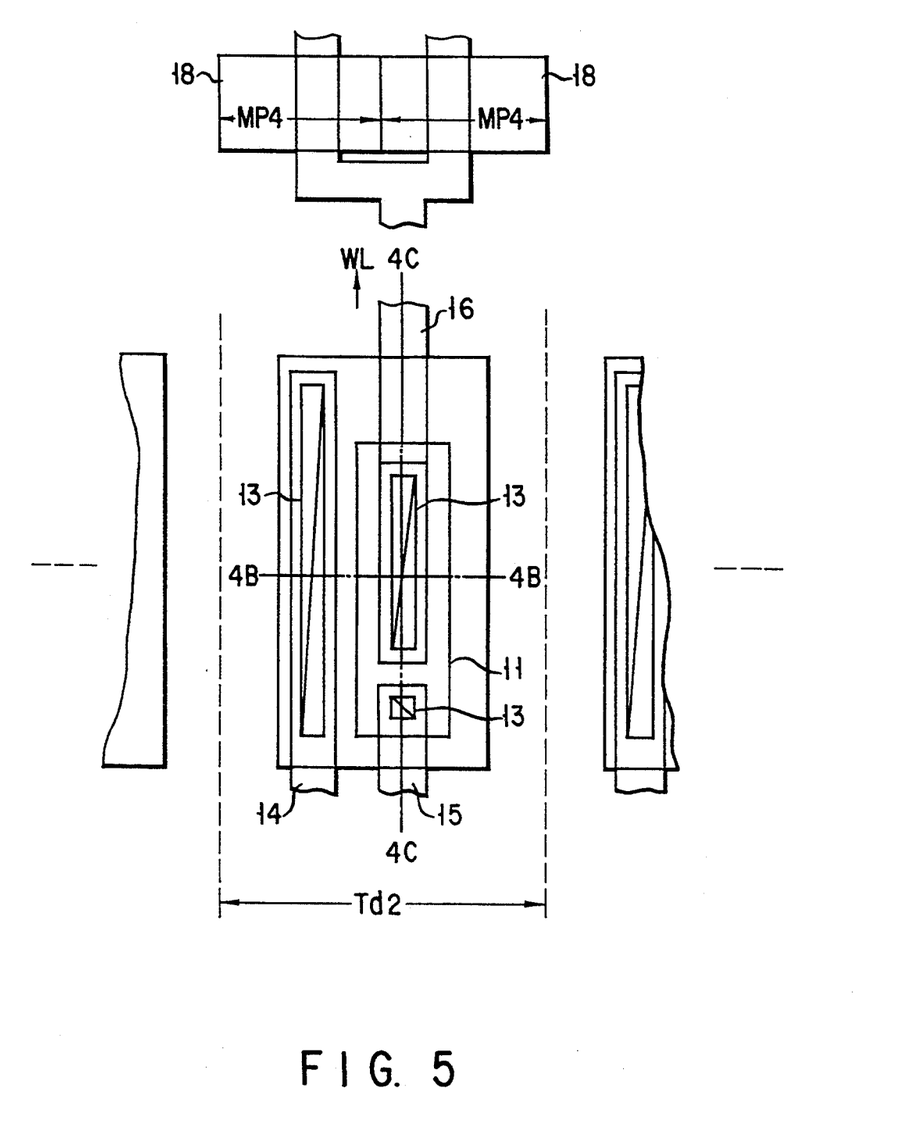
FIG. 5 is an application of FIG. 4A wherein a ½ structure of FIG. 4A is arrayed for the memory cell pitch.

FIG. 5 shows a layout pattern wherein a ½ bipolar transistor structured as shown in FIG. 4A is arranged for a pitch MP4 of a memory cell 18. In this case, the emitter electrode 16 is connected to two word lines WL.

According to the above-mentioned structure, the collector electrode 14 and the emitter electrode 16 are brought in contact with a direct semiconductor region (diffusion region 4 and emitter region 7) by the metal electrode. The base electrode 15 is connected to base regions (5, 6) through the polycide layer 11 contacting the outer base region 6. Moreover, there are merits in that outer base region 6 is formed in a self-aligning manner by diffusing impurities added to the polycrystalline silicon 9.

Therefore, unlike the conventional structure shown in FIG. 1A, there can be formed the structure in which the parasitic resistance of the emitter or that of the base is not increased even if the emitter electrode and the base electrode are not arranged in parallel. In other words, according to the present invention, it is possible to uniform the distance where the emitter electrode 16 of the bipolar transistor and the base electrode 13 are connected in the diffusion region and minimize the distance.

Accordingly, the short side direction of the bipolar direction can be made small as reliability is maintained as it is. Due to this, according to this structure, even if the memory size is reduced, one to ½ bipolar transistor can be arranged for the memory cell pitch easily than the conventional structure. As a result, this contributes to the reduction of the memory chip such as SRAM (static RAM), DRAM, EPROM, MROM or that of the area of the semiconductor chip on which these memories are mounted.

According to the structure of the present invention, in a case where the same design rule is used, the size Td of the conventional bipolar transistor of FIG. 1A is 16 $\mu$m, and the size Td2 of the bipolar transistor of FIG. 4A is 13 $\mu$m, and is considerably reduced. Thereby, for example, the size of 4M bit-memory chip can be made smaller by 0.5 mm as compared with the conventional structure.

According to the above-mentioned structure, the silicide 10 is metal silicide having a high melting point, and contains at least one of Ni, Mo, W, Co, and Ti, and the metal electrode is preferably Al, Au, Cu, or an alloy thereof.

Figure 6:
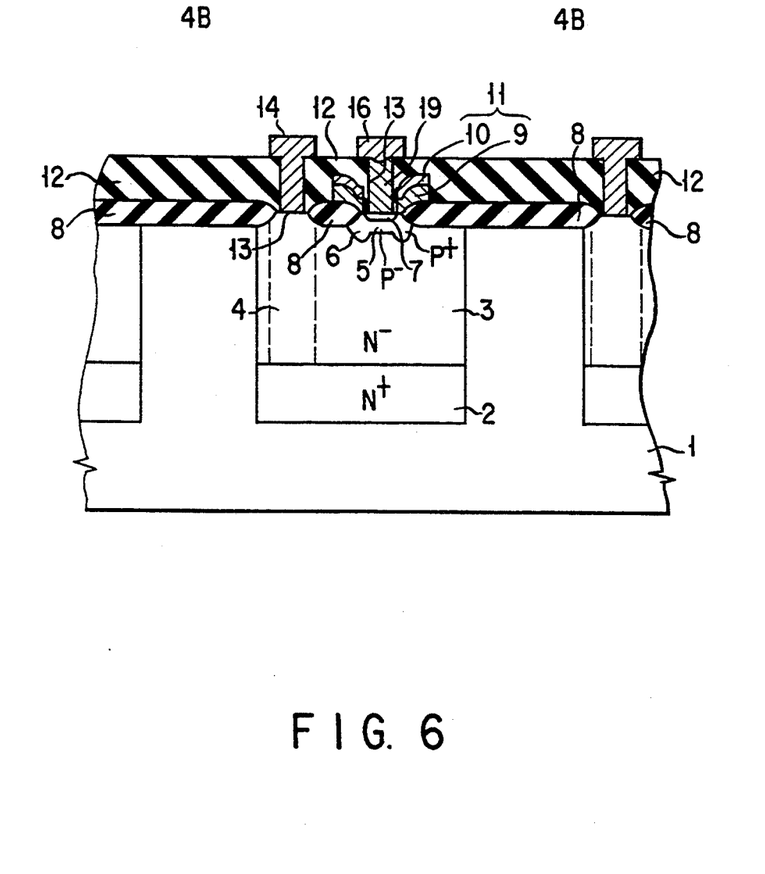
FIG. 6 is a cross sectional view showing the structure of a bipolar transistor according to a second embodiment of the present invention to correspond to FIG. 4B.

FIG. 6 is a cross sectional view showing the structure of the bipolar transistor according to the second embodiment of the present invention to correspond to FIG. 4B. In FIG. 4B, as the emitter electrode 16, there is formed the metal electrode is formed through the contact hole 13. However, the present invention is not limited to the above electrode. The contact hole 13 is filled with polycrystalline silicon 19, and a metallic wire may be formed thereon. According to this structure, the emitter region 7 can be formed by diffusing impurities added to the polycrystalline silicon 19. Due to this, the thin emitter region 7 can be formed in a self-aligning manner, thereby the reduction of the manufacturing process can be expected.

Figure 7:
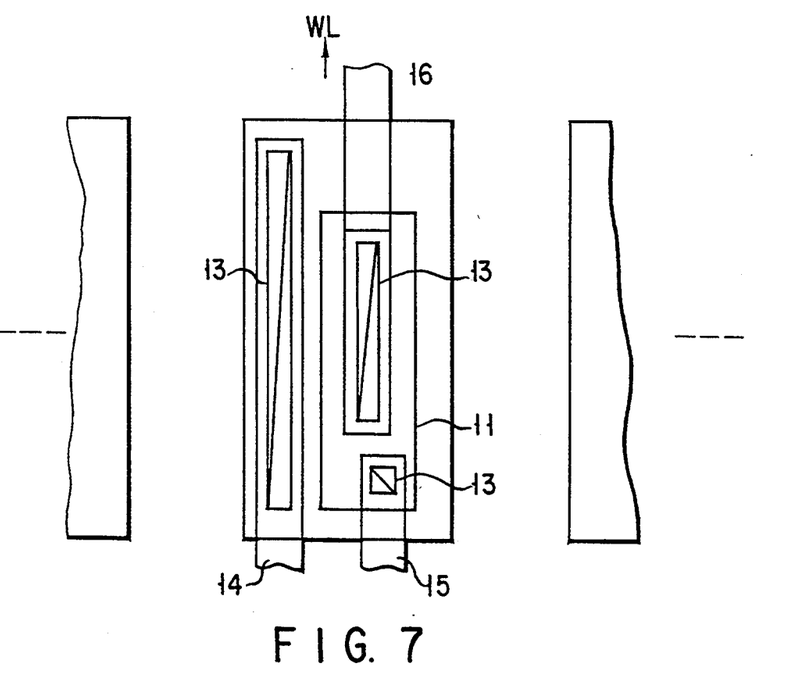
FIG. 7 is a plane view showing the structure of a bipolar transistor according to a third embodiment of the present invention to correspond to FIG. 4A or FIG. 5.
Figure 8:
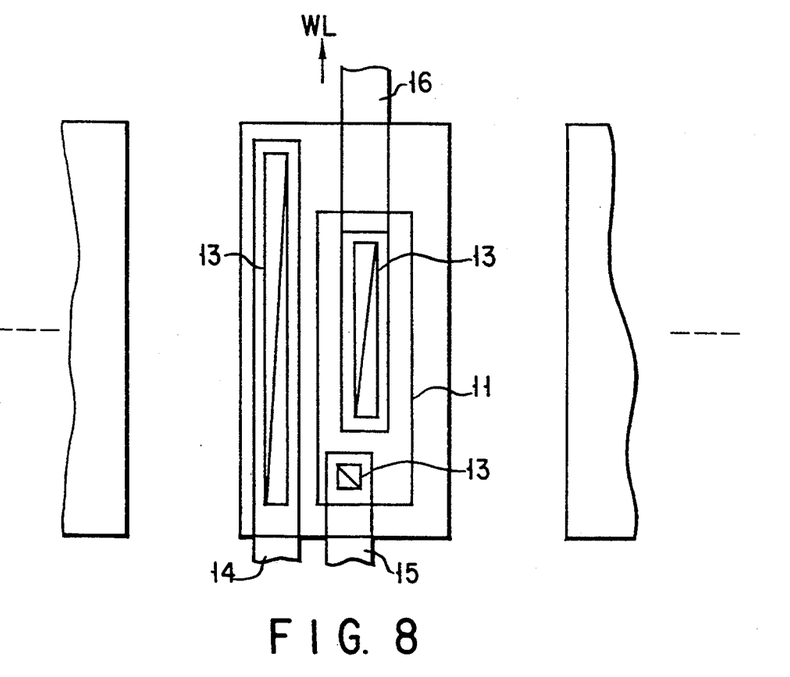
FIG. 8 is a plane view showing the structure of a bipolar transistor according to a fourth embodiment of the present invention to correspond to FIG. 4A or FIG. 5.

FIGS. 7 and 8 are plane views showing the structure of the bipolar transistor according to the third and fourth embodiment of the present invention corresponding to FIG. 4A and FIG. 5, respectively.

In the embodiment of FIG. 4A or FIG. 5, the base electrode 15 is arranged on the same straight line as the emitter electrode 16. However, the present invention is not limited to the above positional relation. In other words, if it is better that the base electrode 14 is not arranged on the same straight line as the emitter electrode 16 to obtain high integration of the entire chip, there may be used an electrode pattern in which the layout of the base electrode 15 or that of the emitter electrode 16 is slightly shifted.

As mentioned above, according to the present invention, the position for taking out the bipolar transistor without deteriorating the characteristic which the conventional device has. Due to this, there can be provided a semiconductor device wherein the arrangement of the bipolar transistor can be easily made in accordance with the memory cell pitch even if the memory size is reduced, and this contributes to the reduction of the chip.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor device comprising:
   bipolar transistors continuously arrayed in a first direction in a semiconductor substrate, and each having a collector electrode, an emitter electrode and a base electrode, each bipolar transistor further comprising:
   a first contact hole for guiding said emitter electrode;
   a second contact hole for guiding said base electrode being, said first contact holes and said second contact hole being arranged in a direction that is substantially at a right angle relative to said first direction, said second contact hole being adjacent to said first contact hole;
   a third contact hole for guiding said collector electrode being arranged so as to be adjacent to both first and second contact holes;
   emitter electrode leading means for extending said emitter electrode in a second direction, said emitter electrode leading means being oriented at substantially a right angle relative to said first direction;
   base electrode leading means for extending said base electrode in a third direction, said base electrode leading means being oriented at substantially a right angle relative to said first direction, the third direction being opposite to said second direction; and
   collector electrode leading means for extending said collector electrode in a direction parallel with said third direction.

2. The semiconductor device according to claim 1, wherein said base electrode is formed on a conductive layer of a polycide structure contacting an active region in said semiconductor substrate.

3. The semiconductor device according to claim 2, wherein said conductive layer contacts said active region, surrounds said first contact hole and extends to a bottom portion of said second contact hole.

4. The semiconductor device according to claim 3, wherein said conductive layer contains metal selected among Ni, Mo, W, Co, Ti as a silicide to be deposited on a polysilicon layer.

5. The semiconductor device according to claim 1, wherein said emitter electrode is formed on said polysilicon layer contacting said active region in said semiconductor substrate.

6. The semiconductor device according to claim 1, wherein Al is used as a main component in each of said collector electrode, said emitter electrode, and said base electrode.

7. The semiconductor device according to claim 1, wherein Au is used as a main component in each of said collector electrode, said emitter electrode, and said base electrode.

8. The semiconductor device according to claim 1, wherein Cu is used as a main component in each of said collector electrode, said emitter electrode, and said base electrode.

9. The semiconductor device according to claim 1, wherein each of said collector electrode, said emitter electrode, and said base electrode is an alloy of a first metal and a second metal selected from Al, Au and Cu.

10. The semiconductor device according to claim 1, wherein each of said collector electrode, said emitter electrode, and said base electrode is an alloy of Al, Au, and Cu.

* * * * *